(12) United States Patent
Takamatsu et al.

(10) Patent No.: US 6,419,772 B1
(45) Date of Patent: Jul. 16, 2002

(54) METHOD FOR ATTACHING RADIO WAVE ABSORBER AND STRUCTURE FOR ATTACHING THE SAME

(75) Inventors: Toshiyuki Takamatsu, Naruto; Toshinori Takao; Masayoshi Suzue, both of Tokushima; Hazime Hara; Hiroshi Nagata, both of Nagoya; Kazuhiko Mori, Higashikurume; Masato Tani; Takashi Hamauzu, both of Tokushima, all of (JP)

(73) Assignees: Otsuka Chemical Co., Ltd., Osaka; Otsuka Science Co., Ltd., Aichi, both of (JP)

( * ) Notice: Subject to any disclaimer, the term of this patent is extended or adjusted under 35 U.S.C. 154(b) by 0 days.

(21) Appl. No.: 09/402,652
(22) PCT Filed: Oct. 14, 1998
(86) PCT No.: PCT/JP98/04652
§ 371 (c)(1),
(2), (4) Date: Oct. 8, 1999
(87) PCT Pub. No.: WO99/41962
PCT Pub. Date: Aug. 19, 1999

(30) Foreign Application Priority Data

Feb. 10, 1998 (JP) ............................................. 10-028750

(51) Int. Cl.⁷ ............................................... B32B 31/00
(52) U.S. Cl. ................................ 156/71; 52/27; 52/39; 52/DIG. 10
(58) Field of Search ............................... 156/71; 52/27, 52/39, 144, DIG. 10

(56) References Cited

U.S. PATENT DOCUMENTS

| 2,882,989 | A | * | 4/1959 | Breuel et al. | ............... 52/144 X |
| 2,895,704 | A | * | 7/1959 | Urbain et al. | ................ 52/27 X |
| 3,068,956 | A | * | 12/1962 | Cooley | ....................... 52/144 X |
| 3,857,459 | A | * | 12/1974 | Adams et al. | ............. 52/144 X |

FOREIGN PATENT DOCUMENTS

| JP | 63-55494 | 4/1988 |
| JP | 6-275981 | 9/1994 |
| JP | 9-199885 | 7/1997 |

* cited by examiner

Primary Examiner—Mark A. Osele
(74) Attorney, Agent, or Firm—Smith, Gambrell & Russell, LLP

(57) ABSTRACT

The present invention attains a microwave absorber attachment in a readily, rapidly and stable manner. According to the microwave absorber attaching method and structure of the present invention, a plurality of ferrite plates 4 are bonded to a shield plate 2 at an installation place such as the ceiling, a wall, the floor or the like; the base portion of a support rod 6 is connected to the ferrite plates 4, causing the support rod 6 to project therefrom; a microwave absorber 1 is placed with its base portion placed along the ferrite plates 4; the support rod 6 passes through a tip opening 11 of the microwave absorber 1, causing the support rod 6 to project therethrough; a covering tray 8 allows for the support rod 6 to pass therethrough to cover the microwave absorber 1; and a fastening member is fastened to a tip threaded portion 12 of the support rod 6, thus attaching the microwave absorber 1 to the installation place. The gaps between adjacent ferrite plates 4 are filled with a magnetic sealing agent.

20 Claims, 16 Drawing Sheets

F I G. 12
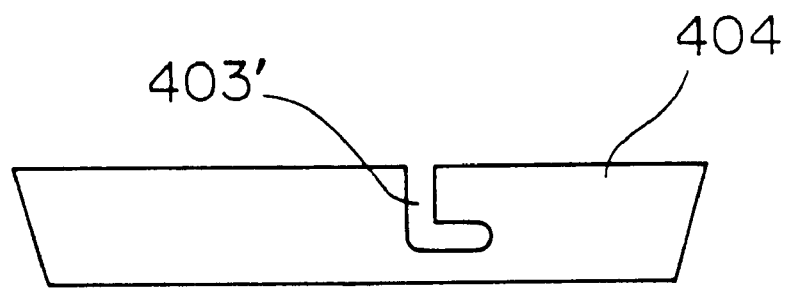
F I G. 13
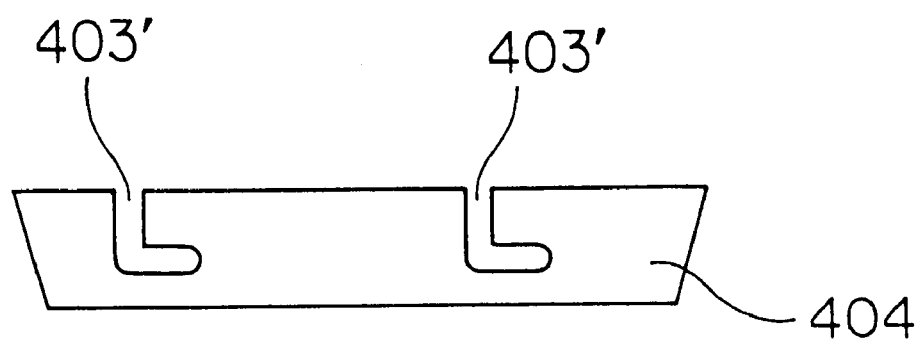

F I G. 15
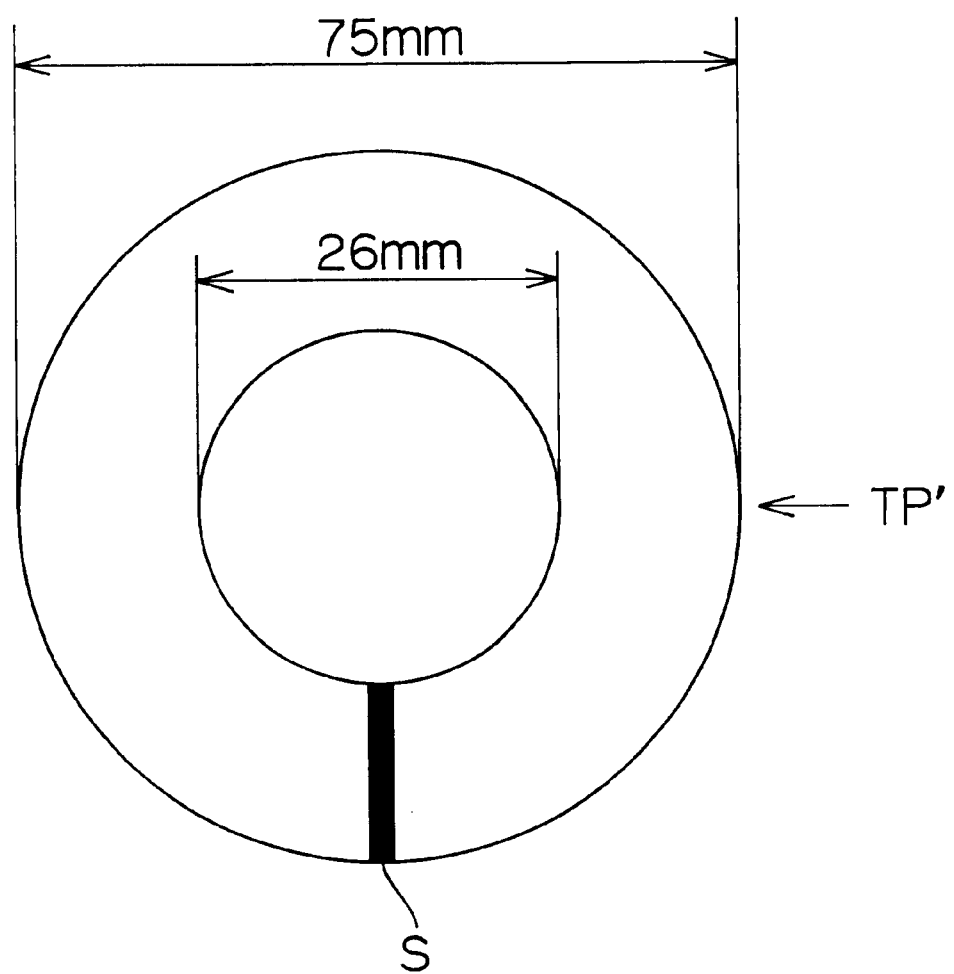

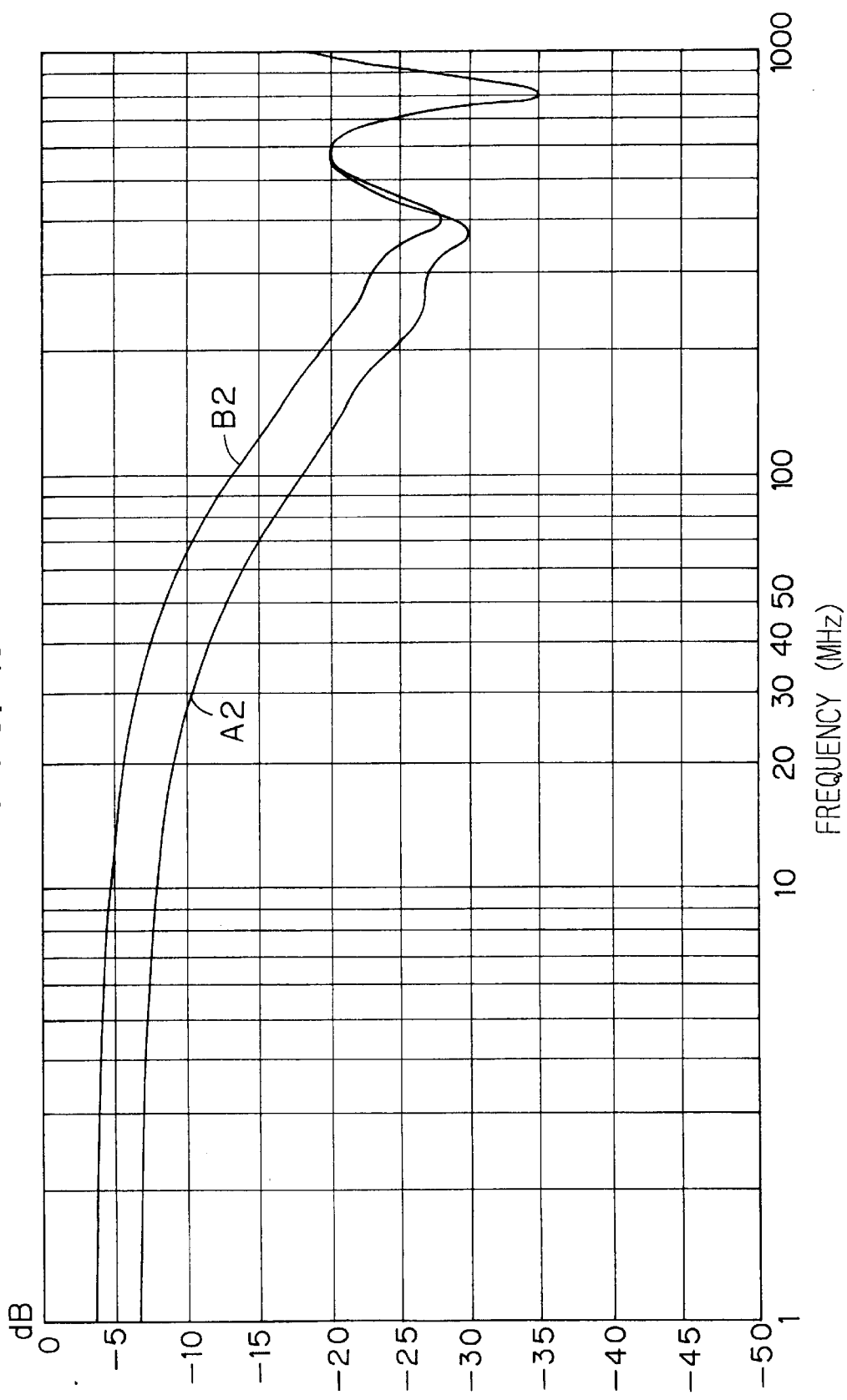

METHOD FOR ATTACHING RADIO WAVE ABSORBER AND STRUCTURE FOR ATTACHING THE SAME

FIELD OF THE INVENTION

The present invention relates to a method of and a structure for attaching a microwave absorber to the ceiling, a wall, the floor or the like.

DESCRIPTION OF RELATED ART

A simulation on electromagnetism jamming or microwave reflection characteristics has conventionally been conducted with the use of a microwave anechoic chamber or a microwave semi-anechoic chamber. For attaching microwave absorbers to the ceiling, walls, floor and the like of such a chamber, there has been employed an adhesive bonding method of bonding the bottoms of the microwave absorbers to the installation sides of the chamber. According to this method, the microwave absorbers are required to be fixed with the use of jigs or frames until the adhesives are perfectly solidified.

According to this method, however, such fixation takes time and care should be used such that the microwave absorbers are not damaged in the course of fixation. Thus, this method has never been suitable for attachment of microwave absorbers in a stable, rapid and easy manner. Further, replacement of used microwave absorbers with new ones has also been troublesome.

In view of the foregoing, it is an object of the present invention to attach microwave absorbers in a much more stable, rapid and easier manner as compared with the prior art.

DISCLOSURE OF THE INVENTION

To achieve the object, the present invention provides a microwave absorber attaching method comprising: bonding a plurality of ferrite plates to a shield plate at an installation place such as the ceiling, a wall, the floor or the like; connecting the base portion of a support rod to the ferrite plates, causing the support rod to project therefrom; placing a microwave absorber with its base portion placed along the ferrite plates; passing the support rod through a tip opening of the microwave absorber, causing the support rod to project through the tip opening; passing the support rod through a covering tray to cover the microwave absorber; and fastening a fastening member to a tip threaded portion of the support rod, whereby the microwave absorber is attached to the installation place.

According to the attaching method of above, with the use of the support rod connected to the ferrite plates at the installation place, a microwave absorber can readily, quickly and stably be attached as placed along the ferrite plates.

The present invention also provides a microwave absorber attaching method comprising: bonding a plurality of ferrite plates to a shield plate at an installation place such as the ceiling, a wall, the floor or the like; connecting the base portion lateral side of the microwave absorber positioned at each end of the installation place, to the ferrite plates with the use of fixing jigs; and coupling adjacent microwave absorbers, to each other, with the use of ferrite-plate fixing jigs for fixing thereof to the ferrite plates and with the use of positioning jigs to be inserted between jig members of the ferrite-plate fixing jigs, whereby the microwave absorbers are attached to the installation place.

According to the attaching method of immediately above, with the use of the base lateral sides of microwave absorbers instead of the support rod, a number of microwave absorbers can successively be attached with no spaces wasted. This enables the microwave absorbers to be very readily, quickly and stably attached.

Further, according to another attaching method jointly using the methods above-discussed, microwave absorbers can be attached in a further stable manner.

As further set forth, the present invention provides a microwave absorber attaching method comprising: bonding a plurality of ferrite plates to a shield plate at an installation place such as the ceiling, a wall, the floor or the like; attaching, to the ferrite plates, supports through which a hanging shaft passes; and engaging, with the hanging shaft, engagement portions of a microwave absorber at the base portion thereof, whereby the microwave absorber is attached as placed along the ferrite plates.

According to the attaching method of immediately above, no other member is required to be attached to the tip of the microwave absorber. This not only stabilizes the performance of the microwave absorber, but also simplifies the attachment thereof.

As also set forth, the present invention provides a microwave absorber attaching method wherein: a plurality of ferrite plates are bonded directly to a shield plate; or a plurality of ferrite plates are previously bonded to a panel, through which the plurality of ferrite plates are then bonded to a shield plate.

Bonding the ferrite plates directly to the shield plate, is suitable to field execution. On the other hand, previously bonding the ferrite plates to the panel is advantageous in view of previous preparation at the factory, thus facilitating the delivery of the ferrite-bonded panel to the execution field.

The present invention may be arranged such that the gaps between adjacent ferrite plates are sealed with a magnetic sealing agent. The present invention may be arranged such that the gaps between adjacent ferrite plates and the gaps between adjacent ferrite-bonded panels are sealed with a magnetic sealing agent.

According to the invention, the following problems can be solved.

For sticking tile-like ferrite plates to the base plate without any gaps between adjacent ferrite plates in order to dispose microwave absorbers for forming a microwave anechoic chamber or the like, the workers are required to have excessive concentration. This lengthens the term of works with an increase in execution cost. In fact, most of the ferrite plates are not smooth and flat at the peripheral contours thereof. It is therefore often required to polish the ferrite plates, causing the same to be smoothed and flattened at the peripheral contours thereof. This results in excessive increase in execution cost for sticking the ferrite plates. Even though the ferrite plates are stuck without any gaps between adjacent ferrite plates, there are inevitably produced gaps between adjacent ferrite plates, with the passage of time after the execution, due to distortion of the base plate or the structure including the base plate, or due to external force such as that caused by an earthquake or the like.

In view of the foregoing, it has been proposed to overcome such a gap problem by putting linings, or by producing, with high precision, ferrite plates with the use of molds. According to the method using linings, a number of linings are required. This not only increases the cost, but also requires much labor for disposing such linings. The method using molds is also disadvantageous in view of much labor for sintering and machining the ferrite plates.

The problems above-mentioned can be solved by the use of the magnetic sealing agent to fill the gaps.

The present invention may be arranged such that the magnetic sealing agent comprises magnetic powder and a binder, and is arranged to penetrate the gaps under a capillary action and to be hardened later.

Here, the gaps refer to the gaps between adjacent ferrite plates and to the gaps between adjacent ferrite-bonded panels, but are not limited thereto.

According to this simple and economical method of applying the magnetic sealing agent to the gaps, the magnetic sealing agent penetrates the gaps and is then hardened to fill the gaps, thus preventing the microwave absorbing capacity from being lowered due to gaps. Further, this involves less likelihood that after application, the magnetic sealing agent is greatly contracted to produce gaps again.

We set forth specific embodiments of the magnetic sealing agent.

As an attaching structure for embodying the microwave absorber attaching method, the present invention provides a microwave absorber attaching structure for attaching a microwave absorber to a shield plate of an installation place such as the ceiling, a wall, the floor or the like, this structure comprising:

(1) a plurality of ferrite plates bonded to a shield plate;
(2) a support rod to be connected at the base portion thereof to the ferrite plates, causing the support rod to project therefrom;
(3) a microwave absorber of which base portion is placed along the ferrite plates;
(4) a covering tray through which the support rod passes through to project through a tip opening of the microwave absorber, such that the microwave absorber is covered by the covering tray; and
(5) a fastening member to be fastened to a threaded portion at the tip of the support rod.

The structure above-mentioned is suitable for embodying the microwave absorber attaching method discussed on page 2 hereof.

The present invention also provides a microwave absorber attaching structure for attaching a microwave absorber to a shield plate of an installation place such as the ceiling, a wall, the floor or the like, this structure comprising:

(1) a plurality of ferrite plates bonded to a shield plate;
(2) microwave absorbers of which base portions are placed along the ferrite plates;
(3) fixing jigs for attaching, to an installation place, the base portion lateral side of the microwave absorber positioned at each end of the installation place; and
(4) fixing jigs and positioning jigs for coupling adjacent microwave absorbers to each other.

According to the structure above-mentioned, microwave absorbers can be attached more readily and more economically in a more stable manner as compared with the attaching structure discussed immediately above.

The present invention may be arranged such that those plate members of the fixing jigs set forth at (3) immediately above and those plate members of the fixing jigs and the positioning jigs set forth at (4) immediately above which are parallel to the ferrite plates, are attached as positioned between the ferrite plates and the microwave absorbers.

The present invention provides a microwave absorber attaching structure for attaching a microwave absorber to a shield plate of an installation place such as the ceiling, a wall, the floor or the like, this structure comprising:

(1) a plurality of ferrite plates bonded to a shield plate;
(2) supports attached to the ferrite plates;
(3) a hanging shaft passing through the supports; and
(4) a microwave absorber provided at the base portion thereof with engagement portions which engage with the hanging shaft.

The structure immediately above is suitable for embodying the further attaching method of page 4, and is advantageous in view of simplification of the microwave absorber attaching structure and convenient delivery of the parts.

EFFECTS OF THE INVENTION

The microwave absorber attaching method and structure of the present invention produce the following effects:

(1) A hollow pyramid-shape microwave absorber can be attached to ferrite plates bonded to the ceiling, a wall, the floor or the like without the microwave absorber damaged and without troublesome previous preparation required.

(2) Unlike a method of prior art of sticking the bottom side of a hollow pyramid-shape microwave absorber to a ferrite surface, the method of the present invention does not involve the likelihood that with the passage of time, the adhesion is deteriorated to cause the microwave absorber to fall down from the ceiling or the wall. This enables the execution work to be highly reliable.

(3) According to a method of prior art, a thin, hollow pyramid-like microwave absorber is small in bottom area to possibly reduce the whole adhesive strength. However, the present invention does not involve such possibility.

(4) According to a method of prior art, it is required to fix a microwave absorber with suitable jigs or frames until the adhesives are perfectly solidified. According to the present invention, on the other hand, the fixation of a microwave absorber can be completed by merely fastening fastening members such as bolts, nuts or the like. This not only shortened the period of time of attaching work, but also lowers the cost.

(5) When there is used a microwave absorber attaching structure of which major parts are made of plastic which does not reflect microwaves, this does not impede the performance of the microwave absorber.

(6) As compared with an adhesive bonding method of prior art, the present invention is advantageous in view of easy maintenance and easy replacement to a microwave absorber having a different microwave reflection capacity (for example, due to future change in frequency characteristics).

(7) Filling the gaps between adjacent component elements with a magnetic sealing agent, prevents the microwave absorbing capacity from being lowered.

BRIEF DESCRIPTION OF THE DRAWINGS

FIG. 12 is a front view of a lining plate for a microwave absorber to be attached to a wall;

FIG. 13 is a front view of a lining plate for a microwave absorber to be attached to the ceiling;

FIG. 15 is a plan view of a test piece made of ferrite of which clearance in FIG. 14 is filled with a magnetic sealing agent;

FIG. 19 is a graph illustrating the results of microwave absorbing capacity evaluation tests conducted on the panel in FIG. 17 and the microwave absorber in FIG. 18.

PREFERRED EMBODIMENTS CARRYING OUT THE INVENTION

The following description will discuss embodiments of the present invention with reference to the attached drawings.

Figure 1:
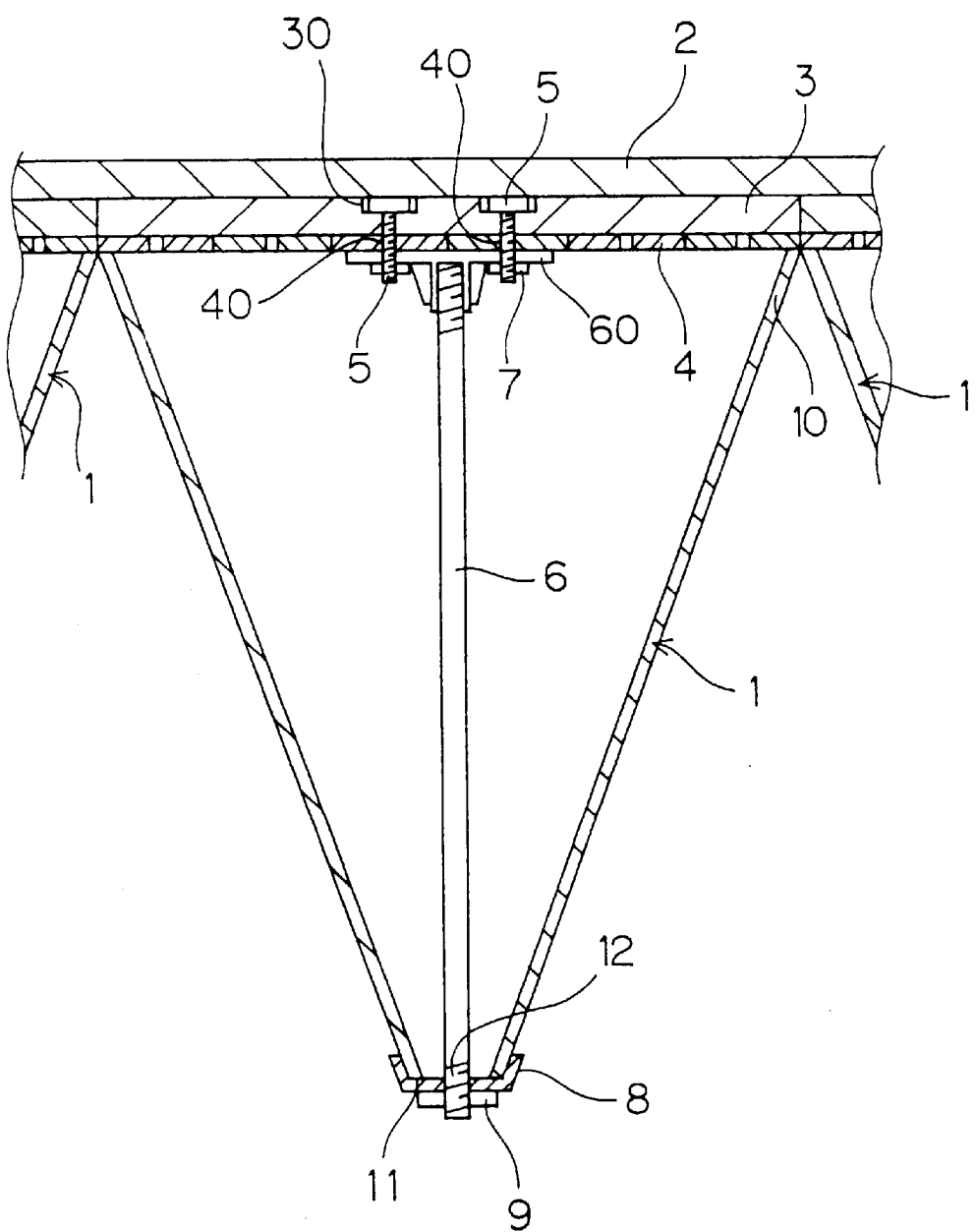
FIG. 1 is a section view of a microwave absorber as attached.
Figure 2:
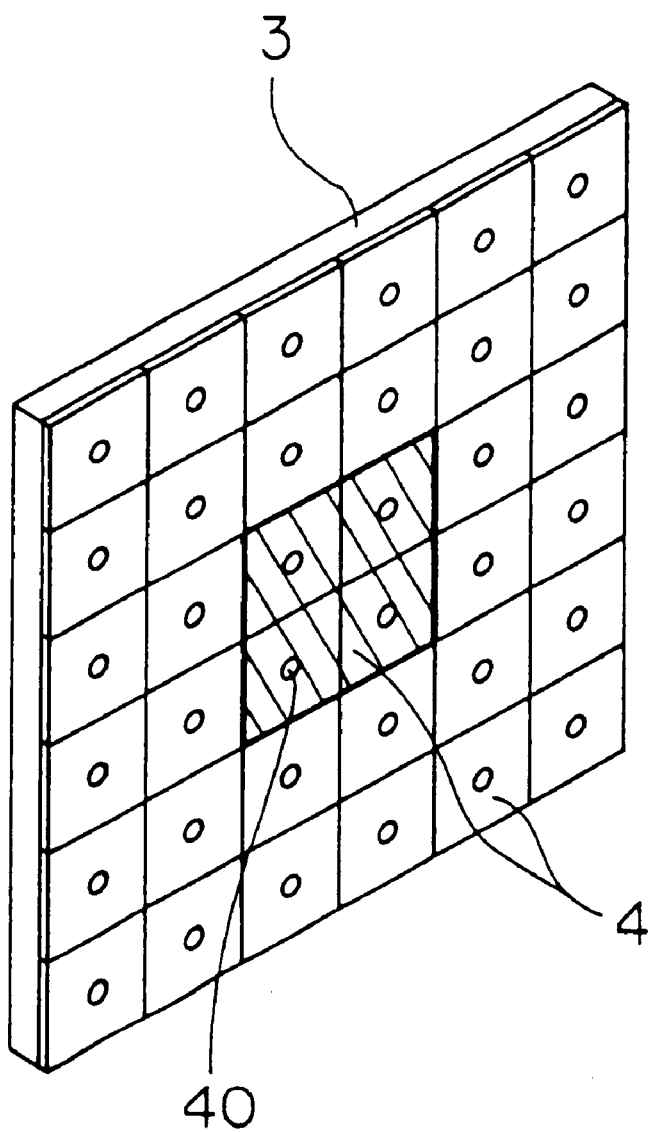
FIG. 2 is a perspective view of ferrite plates attached to a panel.

In FIGS. 1 and 2, a microwave absorber 1 has a hollow pyramid form of which tip is slightly cut, and is arranged to be attached, with the use of an attaching structure to be discussed later, to an installation side such as the ceiling, a wall, the floor or the like.

Disposed at the installation side is a shield plate 2 made of steel, to which plywood panels 3 are to be bonded. As shown in FIG. 2, total 36 ferrite plates 4 (100 mm each in length and width), for example six plates 4 each in length and width, are bonded to the surface of each plywood panel 3 (60 cm each in length and width, and 1.1 cm in thickness). Each ferrite plate 4 is provided at the center thereof with a circular hole 40 having a diameter of about 10 mm. In particular, the four hatched ferrite plates 4 at the center in FIG. 2 are used for fixing a support board, to be discussed later, with the use of the holes 40.

The gaps between adjacent ferrite plates 4 and the small gaps between adjacent panels 3 to which ferrite plates 4 are being bonded, are filled with a magnetic sealing agent. More specifically, the magnetic sealing agent is used according to the following two steps (a) and (b), the step (b) being conducted after the step (a):

(a) When bonding ferrite plates 4, the magnetic sealing agent is applied to the necessary peripheral sides of the ferrite plates 4 to prevent any gap being produced.

(b) The magnetic sealing agent is applied to the gaps if produced between adjacent ferrite plates 4. The magnetic sealing agent penetrates the insides of the gaps, causing the gaps to be filled.

Bonding the ferrite plates 4 at the step (a) may be conducted according to one of the following two methods (i) and (ii):

(i) Bonding directly to the shield plate 2

The magnetic sealing agent is applied to two sides of a ferrite plate 4, which is then bonded to the wall (ceiling) while being pushed to the adjacent ferrite plates 4 which have already been bonded to the wall (ceiling), with force sufficient to prevent a gap from being produced with respect to these adjacent ferrite plates 4 (not shown).

(ii) Total 6×6=36 ferrite plates 4 are previously bonded to each veneer plywood panel 3 (600 mm in each length and width and 110 mm in thickness). These plywood panels 3 having ferrite plates bonded thereto, are delivered to a job site where the plywood panels 3 are to be bonded to the shield plate 2. The magnetic sealing agent is applied to two sides of each plywood panel 3, which is then bonded to the wall (ceiling) while being pushed to the adjacent plywood panels 3 which have already been bonded to the wall (ceiling), with force sufficient to prevent a gap from being produced with respect to these adjacent plywood panels 3 (See FIG. 2).

The step (b) is to be conducted at the time of gap check after the method (i) or (ii) has been conducted. Generally, the method (ii) provides better anechoic chamber characteristics and better workability than the method (i). However, the method (i) may also be employed according to the selection by the user.

The magnetic sealing agent used for filling the gaps will be described in more detail later.

The following description will discuss the structure for and the method of attaching a microwave absorber 1. As shown in FIG. 1, the panel 3 has holes 30 communicating with holes 40 in ferrite plates 4. With bolts 5, the panel 3 is fixed to a rod fixture 60 which serves as a base portion of a hanging support rod 6 made of plastic. That is, the bolts 5 are fastened with respect to nuts 7 at the underside of the rod fixture 60. The support rod 6 downwardly hangs and projects.

The microwave absorber 1 is disposed with its base-side portion 10 placed along the ferrite plates 4. The support rod 6 projects through the microwave absorber 1 at its tip opening 11. A covering tray 8 is put on the support rod 6 to cover the tip of the microwave absorber 1. A nut 9 or the like serving as fastening means is tightened to a threaded portion 12 which is formed at the tip of the support rod 6 and which projects through the tip opening 11. Thus, the microwave absorber 1 is attached to and supported by the support rod 6.

The foregoing shows a case where the installation place is the ceiling and the microwave absorber 1 is attached to the ceiling as suspended therefrom. However, an attaching method using a structure similar to that above-mentioned can be used for a case where the microwave absorber 1 projects horizontally from a wall or where the microwave absorber 1 stands vertically from the floor.

Figure 3:
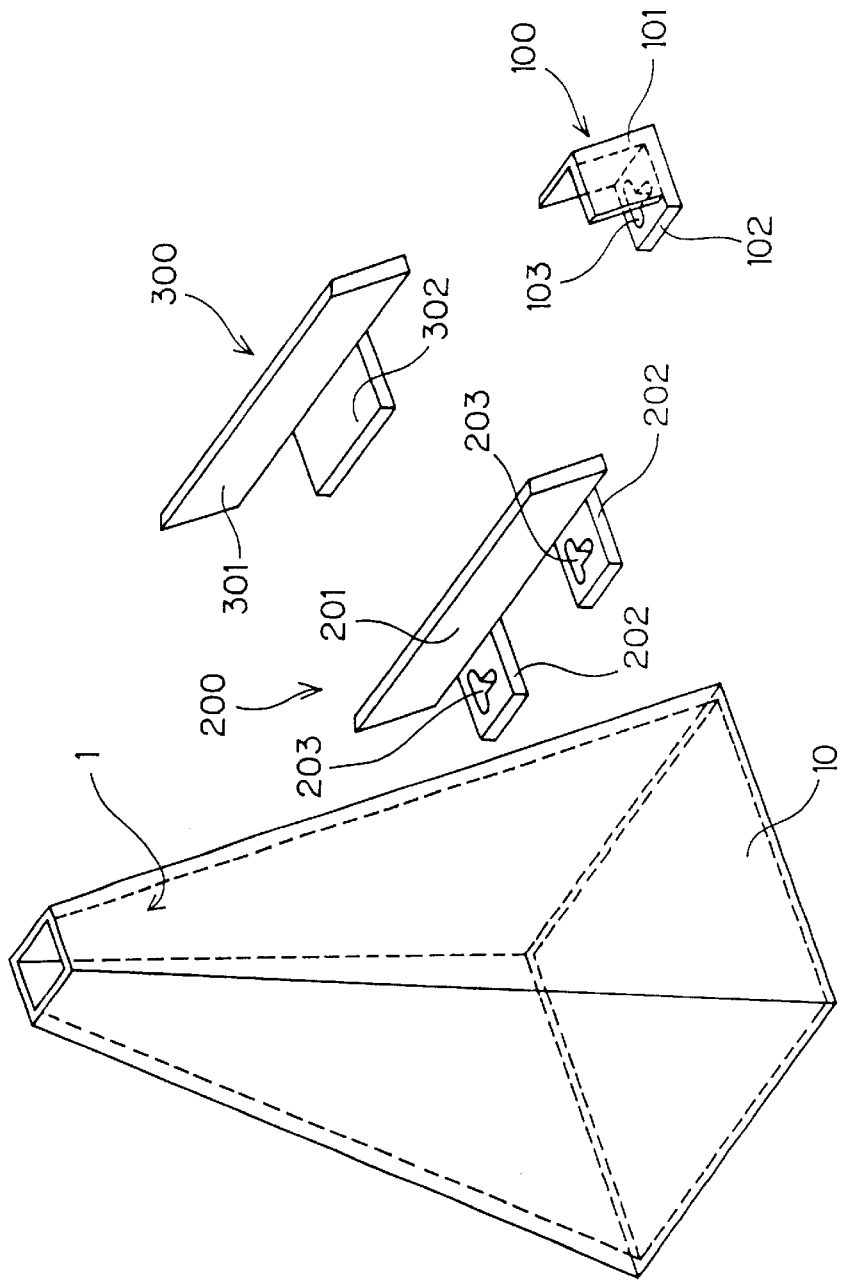
FIG. 3 shows a microwave absorber and attaching jigs according to a modification of the present invention.
Figure 4:
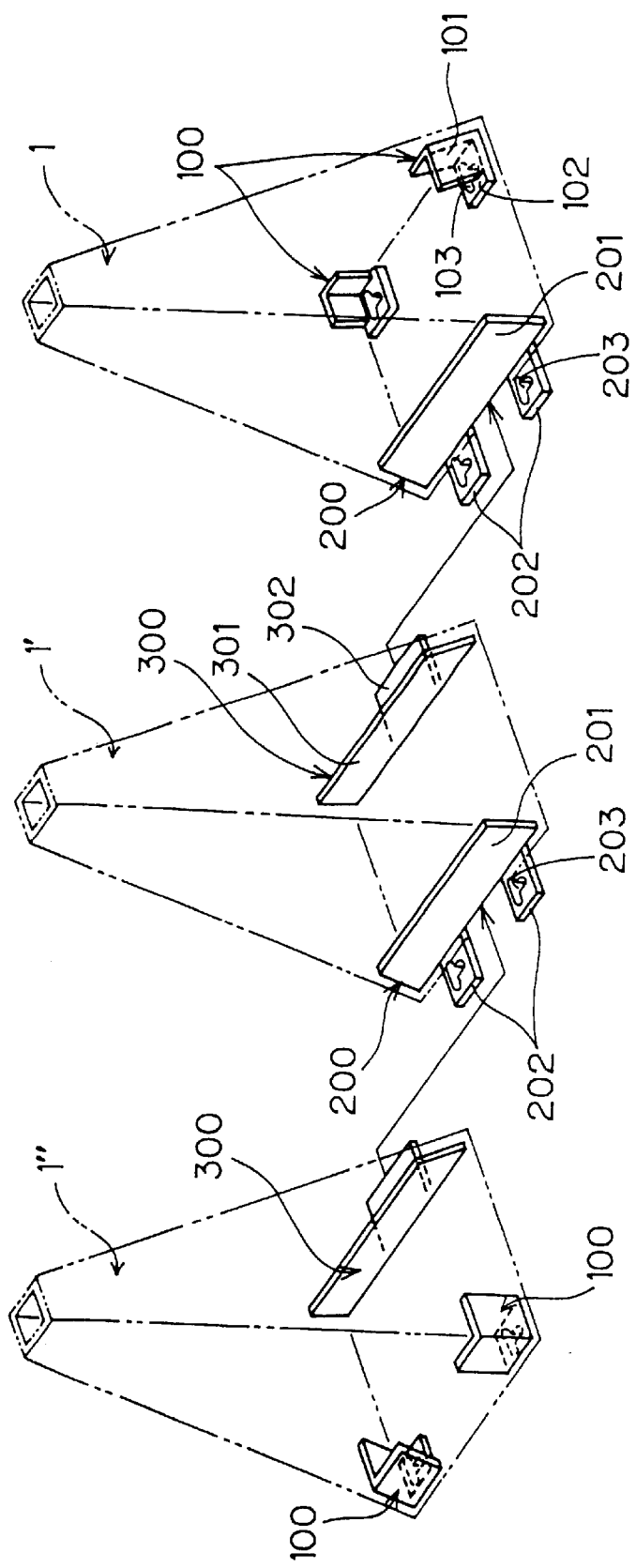
FIG. 4 is a perspective view of microwave absorbers to which the attaching jigs in FIG. 3 are attached.
Figure 5:
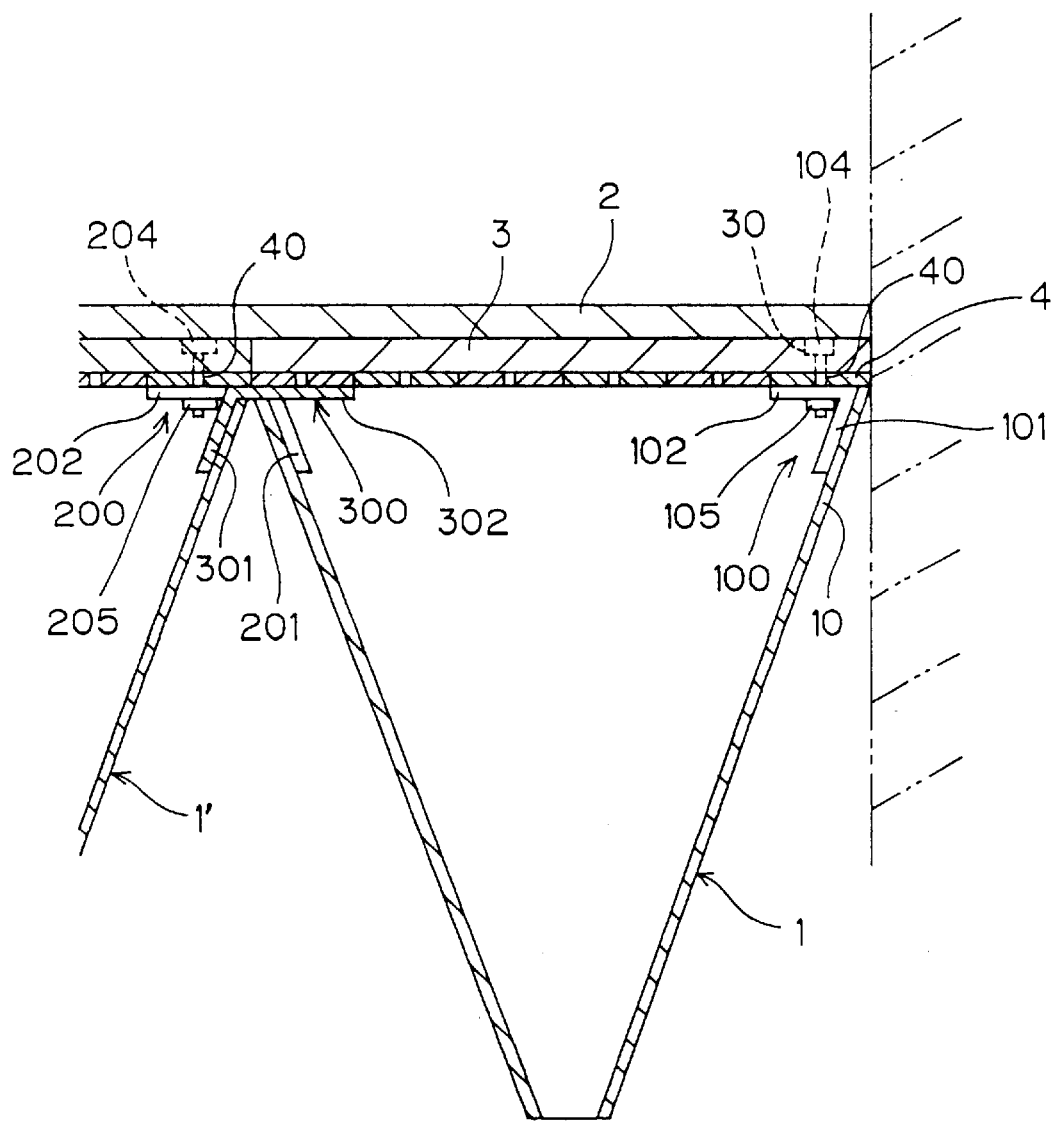
FIG. 5 is a section view of microwave absorbers as attached with the use of the attaching jigs according to the modification.

FIG. 3 to FIG. 5 show a modification of the attaching structure and method. FIG. 3 shows jigs to be used. FIG. 4 shows microwave absorbers 1, 1" which will respectively be positioned at both ends of the installation place, and a microwave absorber 1' which will be disposed at an intermediate position (such microwave absorber 1' is often used in a plural number even though a single microwave absorber 1' is shown in FIG. 4).

All microwave absorbers are to be attached with the use of the lateral sides of the base-side portions 10 of microwave absorbers. Fixing jigs 100 are to be used for the microwave absorber 1 positioned at the right end of the installation place. Each fixing jig 100 comprises a corner portion 101 and an attaching plate 102 having a screw hole 103. The microwave absorber 1 is fixed with the fixing jigs 100 fitted to the right-side corners thereof. More specifically, with the use of holes 30 of a panel 3 and holes 40 of ferrite plates 4, the microwave absorber 1 is fixed with fastening means such as bolts 104, nuts 105 and the like.

A fixing jig 200 comprises a guide plate 201 and at least two attaching plates 202, separated from each other, each having a screw hole 203. This fixing jig 200 is disposed at the other lateral side of the microwave absorber 1 with the guide plate 201 extending along the base portion of this other lateral side. Likewise the attaching plates 102, the attaching plates 202 are fixed with fastening means such as bolts 205, nuts 206 and the like with the use of holes 30 of the panel 3 and holes 40 of ferrite plates 4.

A positioning jig 300 comprises a guide plate 301 and at least one positioning plate 302 to be positioned between the at least two attaching plates 202 separated from each other. This positioning jig 300 is attached to the microwave absorber 1' at its lateral side which is opposite to and connected to the other lateral side of the microwave absorber 1. The positioning plate 302 of the positioning jig 300 for the microwave absorber 1' is inserted between the attaching plates 202, separated from each other, attached to the other lateral side of the microwave absorber 1. At the position between the at least two attaching plates 202 of the already fixed microwave absorber 1, the positioning plate 302 is positioned and stabilized as inserted between the microwave absorber 1 and ferrite plates 4. When disposing a plurality of intermediate microwave absorbers 1' adjacent microwave absorbers 1' are successively attached in a manner similar to that above-mentioned. At the left end of the installation place, the left side of the microwave absorber 1" is attached to ferrite plates 4 with the use of corner fixing jigs 100. FIG. 5 shows the right-side portion of the microwave absorbers thus attached.

Figure 6:
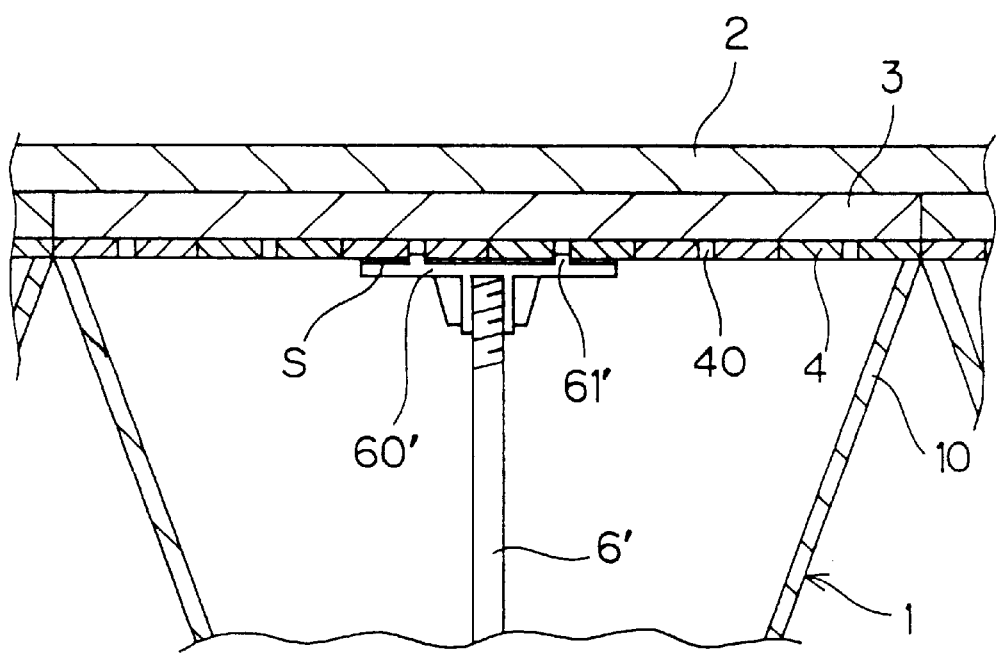
FIG. 6 is a section view of another modification of attachment of microwave absorbers.

FIG. 6 shows a modification of means for fixing the support rod 6 to the ferrite plates 4 and the panel 3 in FIG. 1. According to this modification, a rod fixture 60 is previously attached, with adhesives S, to a predetermined position of ferrite plates 4 when producing a panel 3 having ferrite plates 4 attached thereto. At a construction site of a microwave anechoic chamber or the like, a support rod 6 is threaded into the rod fixture 60 This enables the support rod 6 to be fixed to the ferrite plates 4 in a shorter period of time than the method shown in FIG. 1. Small positioning projections 61 may be disposed on the rod fixture 60 as shown in FIG. 6. In such a case, these small projections 61 can be fitted to the holes 40 of ferrite plates 4 when sticking the rod fixture 60 to the predetermined position of ferrite plates 4. This results in easy and accurate positioning. In FIG. 6, the support rod 6 is fixed to the rod fixture 60 by threaded connection, but may be fixed with the use of a fixing pin or the like.

It is required to previously form, in the lateral side base portions of microwave absorbers, spaces (not shown) into which the attaching plates 202 and the positioning plate 302 are inserted. It becomes convenient when attachment of jigs to microwave absorbers is previously done with the use of adhesives, fastening means or the like. As to the screw holes, there may be threaded holes or through-holes through which screws are to pass.

Figure 7:
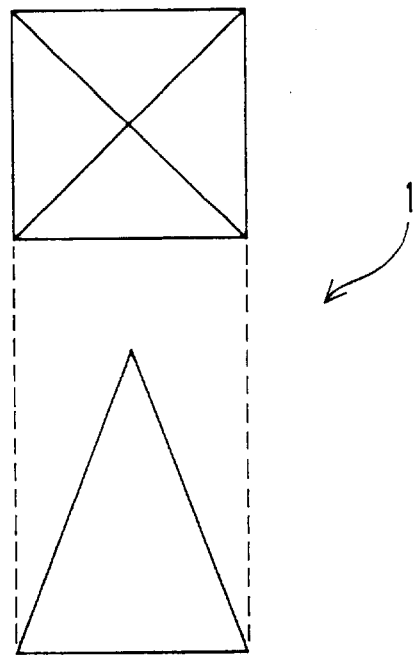
FIG. 7 is plan and front views of an example of a microwave absorber having different shapes.
Figure 8:
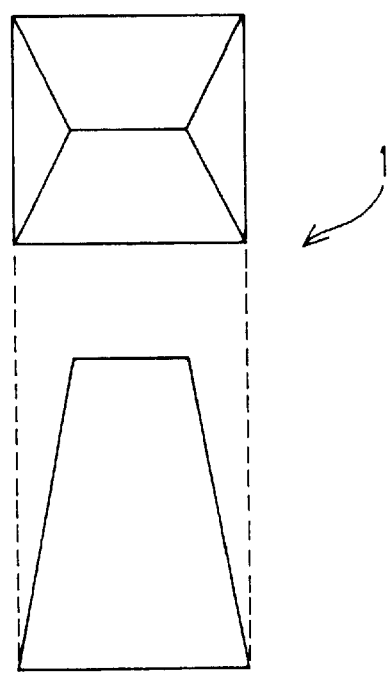
FIG. 8 is plan and front views of another example of a microwave absorber having different shapes.

Shown in the foregoing is a microwave absorber of which tip is cut. However, there may be used a microwave absorber with its tip remaining pointed (See FIG. 7). There may also be used microwave absorbers having a variety of shapes including a hipped-roof shape (See Fig. 8).

FIG. 9 to FIG. 13 show methods of and structures for attaching a microwave absorber 1 with the use of a hanging shaft(s). The following description will discuss in detail these methods and structures with reference to FIG. 9 to FIG. 13.

Figure 9:
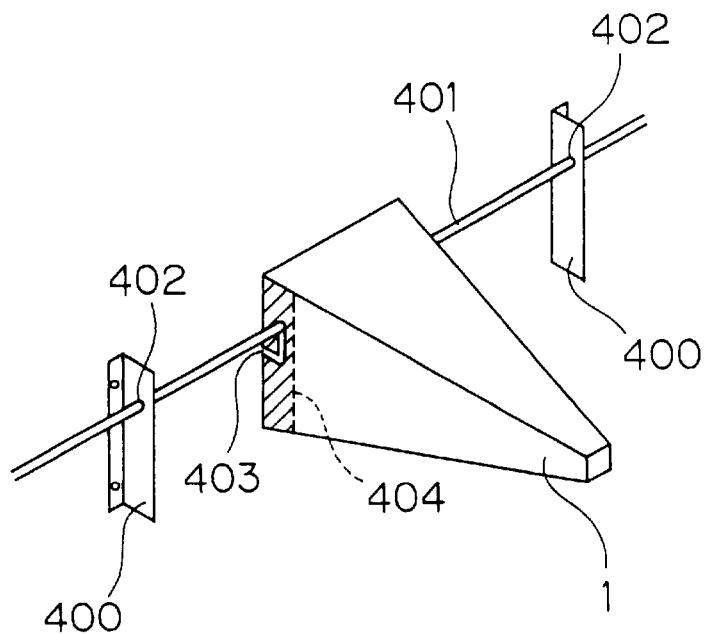
FIG. 9 is a perspective view illustrating a microwave absorber as attached to a wall.
Figure 10:
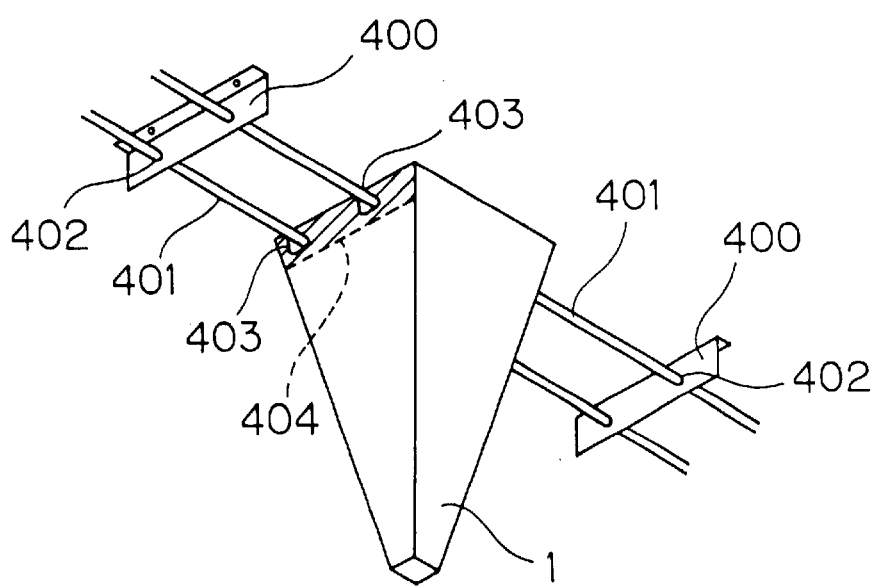
FIG. 10 is a perspective view illustrating a microwave absorber as attached to the ceiling.
Figure 11:
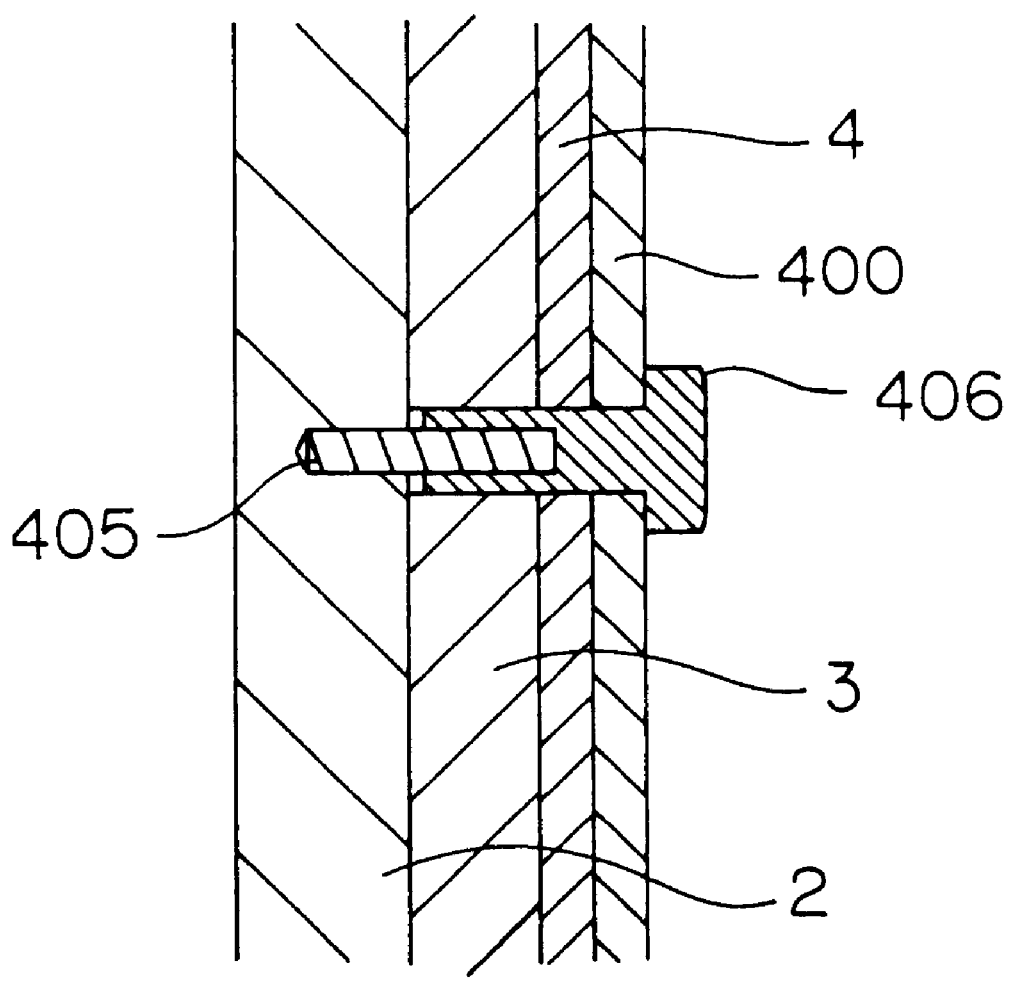
FIG. 11 is a section view illustrating how the support is attached.

FIG. 9 shows a case where a microwave absorber 1 is attached to a wall, while FIG. 10 shows a case where a microwave absorber 1 is attached to the ceiling. In FIGS. 9 and 10, each support 400 is to be attached to ferrite plates as shown in FIG. 11. Each support 400 has a hole(s) 402 in which a hanging shaft(s) 401 passes through. The microwave absorber 1 is provided at the base sides thereof with engagement portions 403 arranged to engage with the hanging shaft(s) 401. In FIGS. 9 and 10, each engagement portion 403 is made in the form of an L-shape engagement hole. For reinforcing the engagement portions 403, lining plates 404 each having an engagement hole(s) 403' are bonded to the insides of the engagement portions 403. FIG. 12 shows the lining plate 404 for a microwave absorber for a wall, while FIG. 13 shows the lining plate 404 for a microwave absorber for the ceiling. In FIG. 11 illustrating an example of attachment of the support 400, there are shown a shield plate 2 and a plywood panel 3 having ferrite plates 4 bonded thereto, and the support 400 is attached to a ferrite plate 4 with a bolt 406 having a tapping screw 405.

For attaching a microwave absorber 1 using the hanging shaft(s) 401, the panel 3 having ferrite plates 4 bonded to the surface thereof, is bonded to the shield plate 2 at the installation place such as the ceiling, a wall, the floor or the like. Then, the supports 400 through which the hanging shaft(s) 401 passes, are attached to ferrite plates 4. The engagement portions 403 of the microwave absorber 1 at the base portion thereof, are engaged with the hanging shaft(s) 401 such that the microwave absorber 1 is attached with its base portion placed along the ferrite plates 4.

The attaching method and structure using the hanging shaft(s) 401 above-mentioned is advantageous in view of easy and rapid attachment, stable performance of the microwave absorber and convenient transportation of the parts.

The microwave absorber 1 may be made of a variety of materials. Examples of the substrate for forming the microwave absorber 1, include (i) a substrate comprising carbon black, an inorganic endothermic filler for giving incombustibility, and an organic binder for giving flexibility, these components being united together in the form of a single layer, and (ii) a substrate comprising a layer chiefly made of carbon black and a layer chiefly made of an endothermic filler and an organic binder, these two layers being bonded to each other.

To be excellent in incombustibility, flexibility, heat insulating properties, and sound insulating properties, the microwave absorber chiefly comprises (i) a conductive filler such as carbon black, (ii) an inorganic endothermic filler and (iii) an organic binder. As the endothermic filler, there may be used a hydroxide such as an aluminium hydroxide or a magnesium hydroxide to give incombustibility. As the organic binder, there may be used a thermoplastic resin such as a vinyl chloride resin, vinylidene chloride, an ethylene-vinyl chloride copolymer particularly to give flexibility, thus preventing the resulting microwave absorber from being fragile.

In addition to calcium carbonate, talc, and zinc oxide, there may be used, as ancillary materials, a foaming agent and a plasticizer to bind the chief component elements, enabling these elements to be molded as incombustible microwave absorber materials. Examples of the foaming agent include AIBN, DPT, TSH, and OBSH. Examples of the plasticizer include toluene and xylene.

The sizes of the ferrite plates and the panels can optionally be set. That is, according to the sizes of microwave absorbers (molded products), the ferrite plates and the panels can be set in size.

As the magnetic sealing agent used for filling the gaps between adjacent ferrite plates 4 and the gaps between adjacent panels 3, there is used a magnetic sealing agent which comprises magnetic powder and a binder, and which can penetrate the gaps under a capillary action and can be hardened later. The present invention provides such a magnetic sealing agent, and a method of producing a microwave absorber with the use of such a magnetic sealing agent.

Examples of the magnetic powder which can be used for the magnetic sealing agent of the present invention, include:

a) Powder of an oxide of iron-type composite metal (ferrite) such as cobalt ferrite, nickel ferrite, nickel-zinc ferrite or the like;

b) Powder of a metallic oxide such as magnetite, a chrome oxide or the like; and c) Powder of metal such as an iron-cobalt alloy, a nickel-cobalt alloy, an aluminium-Heusler alloy or the like.

The magnetic powder to be used is preferably of the type identical with the type of the material of the members (for example, tile-like ferrite plates used for attaching a microwave absorber) which form gaps to be filled with the magnetic sealing agent. For example, ferrite powder is preferable for ferrite plates 4.

Examples of the binder to be used for the magnetic sealing agent include a hardening resin, cement, plaster and the like.

Examples of the hardening resin include (i) resin such as epoxy, unsaturated polyester, vinyl ester, phenol, alkyd, silicone, diallyl phthalate, bismaleimide triazine resin, polyamide, urea, melamine-containing resin, polyurethane or the like, and (ii) a mixture of resins above-mentioned. Of these, a reactive hardening resin is preferable in view of easy filling. There are instances where it is expected that after the magnetic sealing agent has been applied, the gaps filled therewith are subject to expansion and contraction, enlargement, deformation or the like due to distortion of the support substrate of the members between which such gaps are formed, or due to external force of earthquake or the like. In such a case, to maintain the gap filling state effectively for a long period of time, there may preferably be used resin having flexibility even after hardened, such as a reactive hardening resin of the urethane type, the silicon type or the like.

Examples of the cement include portland cement.

The rate of the magnetic powder in the magnetic sealing agent is preferably in the range of 50~95% by weight, more preferably in the range of 65~80% by weight. According to the present invention, the magnetic sealing agent is used for filling the gaps, for example, between adjacent panels 3 or between adjacent ferrite plates 4 in order to magnetically integrating adjacent panels 3 or adjacent ferrite plates 4 to form a magnetic circuit. It is therefore required that the magnetic powder particles in the magnetic sealing agent are mutually close together such that the magnetic circuit is formed. Thus, the rate of the magnetic powder in the magnetic sealing agent is preferably 50% by weight or more, but is not always limited thereto. If the rate of the magnetic powder exceeds 95% by weight, the viscosity is increased too much or it becomes difficult to mix such magnetic powder with a binder. It is therefore preferable that the rate of the magnetic powder is 95% by weight or less.

The magnetic sealing agent may be adjusted such that the viscosity (particularly, the viscosity at the time of gap filling) is in the range of 2~7000 poises, preferably in the range of 1000~7000 poises. If the viscosity exceeds 7000 poises, the penetration of the magnetic sealing agent into gaps is disadvantageously lowered. If the viscosity is below 2 poises, the magnetic sealing agent disadvantageously hangs down or falls when applied to a vertical surface, the ceiling or the like. In view of workability, the viscosity is preferably in the range of about 1000~about 7000 poises. The viscosity can be adjusted by selection of a binder to be used, by dilution with a solvent or the like.

As the binder of the magnetic sealing agent, the reactive hardening resin can be used as mentioned earlier. Particularly, in view of storage of the magnetic sealing agent, a reactive hardening resin of the two-part type is preferably used. As an example of such a magnetic sealing agent, there can be mentioned a magnetic sealing agent of the two-part type including (i) a chief agent comprising magnetic powder and a hardening resin, and (ii) a curing agent.

Further, the magnetic sealing agent of the two-part type preferably comprises a first part of ferrite powder mixed with a hardening resin substrate, and a second part of a curing agent. Example of such a magnetic sealing agent include (i) a two-part-type magnetic sealing agent comprising a first part of ferrite powder mixed with an epoxy component, and a second part of an isocyanate component, (ii) a two-part-type magnetic sealing agent comprising a first part of ferrite powder mixed with a polyester polyol component and a second part of an isocyanate component, (iii) a two-part-type magnetic sealing agent comprising a first part of ferrite mixed with an epoxy modified polyester component and a second part of an isocyanate component, and (iv) a two-part-type magnetic sealing agent comprising a first part of ferrite mixed with a dimethyl silicon component and a second part of a silane coupling agent.

The following description will discuss an example of the magnetic sealing agent to be used in the present invention.

The magnetic sealing agent was produced in the following manner.

First, 30 parts by weight of a dimethyl silicon resin (manufactured by Otsuka Kagaku Co., Ltd. Product Name: PYROKEEP TS-1000, chief agent) was dispersingly mixed with 70 parts by weight of ferrite powder with the use of a three-roll unit, thus forming a mixture. Then, 5 parts by weight of a curing agent of the type of a silane coupling agent(manufactured by Otsuka Kagaku Co., Ltd. Product Name:PYROKEEP TS-1000, curing agent), was added to and mixed with the mixture above-mentioned, thus forming a magnetic sealing agent. The viscosity of the magnetic sealing agent immediately after the addition and mixture above-mentioned, was measured with a B-Type Viscometer manufactured by Tokyo Keiki Seisakusho. The measurement result was 1500 poises.

Tests were conducted for evaluating the performance of the magnetic sealing agent thus obtained. The following description will discuss the test results including the results of comparative tests. Test 2 shows an example of a microwave absorber producing method of the present invention.

Test 1

Figure 14:
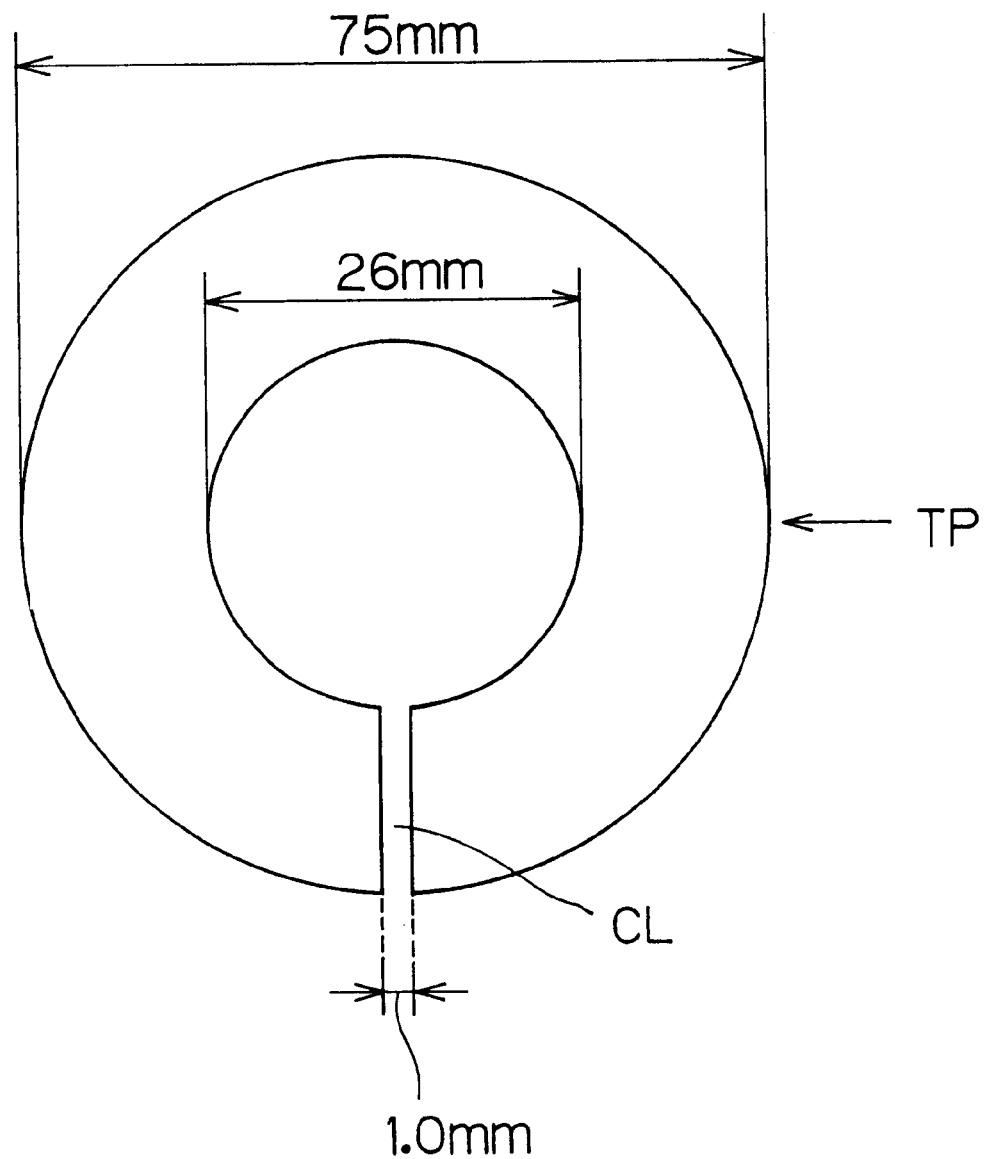
FIG. 14 is a plan view of a test piece made of ferrite having a clearance.

As shown in FIG. 14, there was prepared a toroidal test piece TP of ferrite having an outer diameter of 75 mm, an inner diameter of 26 mm, a thickness of 6 mm and a clearance CL of 1 mm in width which passes through in the thickness direction of the test piece TP. The magnetic sealing agent above-mentioned was dropped in the clearance CL. This magnetic sealing agent S readily penetrated the clearance CL under a capillary action, and was then hardened.

Figure 16:
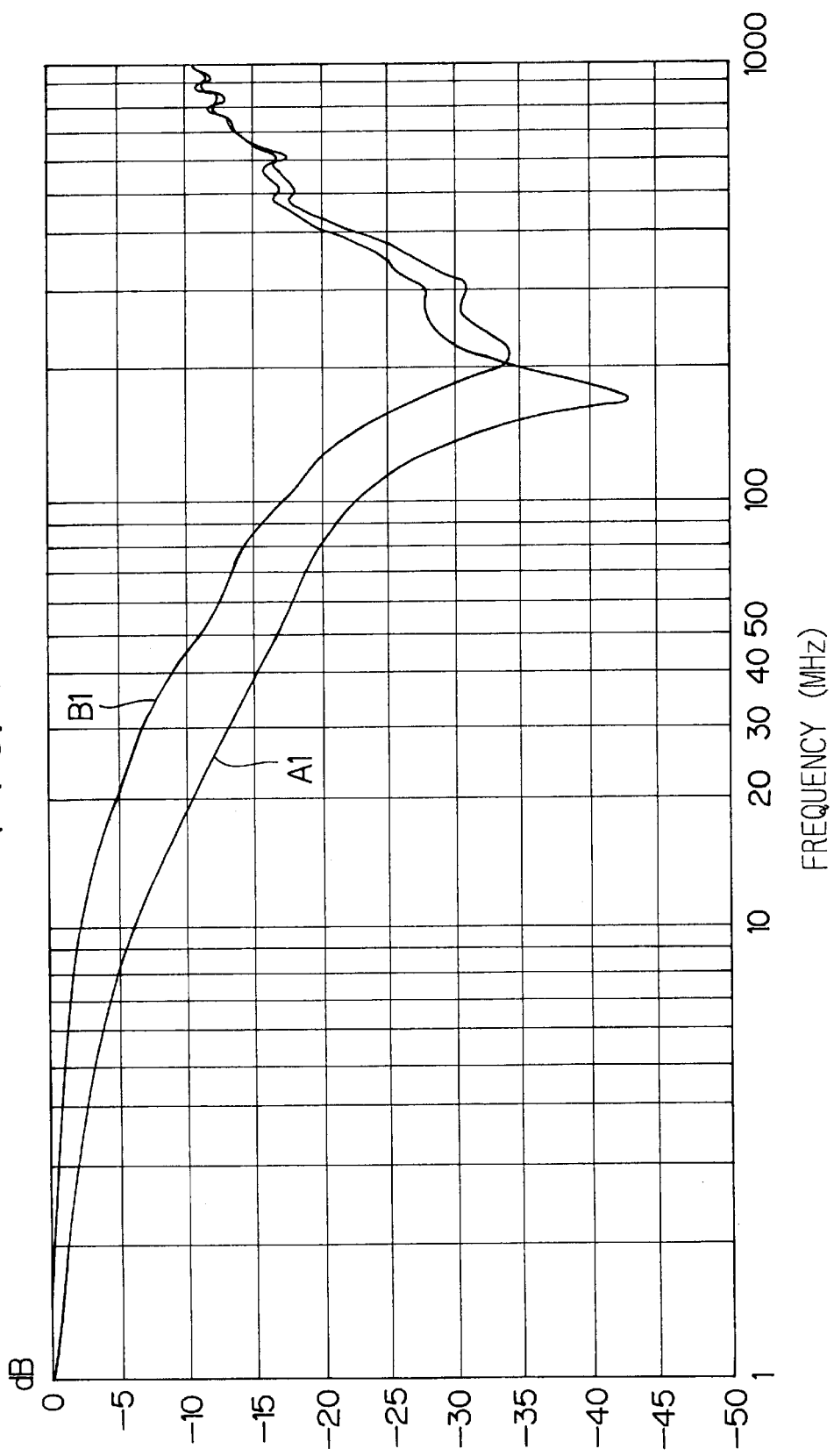
FIG. 16 is a graph illustrating the results of microwave absorbing capacity evaluation tests conducted on the test pieces in FIGS. 14 and 15.

The test piece of which the clearance CL was filled with the magnetic sealing agent S, designated by TP', was mounted on a coaxial tube for executing a coaxial tube method for evaluating a microwave absorbing capacity. Then, microwave return loss rate of the test piece TP' was measured with the use of a network analyzer (manufactured by Yokogawa Hewlett Packard Company). The test result is shown by a line A1 in FIG. 16. In FIG. 16, the axis of abscissa presents microwave frequency and the axis of ordinate presents the return loss rate in dB.

Comparative Test 1

A comparative test 1 was conducted in the same manner as in Test 1, except that there was used a test piece TP shown in FIG. 14 without the clearance CL filled with the magnetic sealing agent S. This test piece TP was measured for microwave return loss rate. The result is shown by a line B1 in FIG. 16.

As understood from FIG. 16, the test piece TP' with its clearance CL filled with the magnetic sealing agent S of the present invention, is excellent in microwave absorbing capacity in the range of 30 MHz~100 MHz, as compared with the test piece TP without its clearance CL filled with the magnetic sealing agent. For example, for the microwave of frequency of 30 MHz, the microwave absorbing capacity of the test piece TP is about −7 dB, but the microwave absorbing capacity of the test piece TP' reaches about −13 dB. It is therefore understood that the magnetic sealing agent S penetrated sufficiently the clearance CL such that the clearance CL was sufficiently filled therewith, thus contributing to microwave absorption.

It is very important that the microwave absorber is excellent in capacity of absorbing microwaves of frequency of 30 MHz and in the vicinity thereof. More specifically, as understood from FIG. 16, even a flat microwave absorber having a clearance presents a sufficient capacity of absorbing microwaves of frequency of several hundreds MHz. Further, microwaves of frequency in the vicinity of 1000 MHz can sufficiently be absorbed by arranging, for example, conical or pyramid-shape projecting microwave absorbers made of material in which carbon black has been dispersed in urethane rubber. However, microwaves of frequency of 30 MHz and in the vicinity thereof cannot sufficiently be absorbed by such projecting microwave absorbers. Further, if clearances are present, the microwave absorbing capacity is decreased.

Test 2

Using the magnetic sealing agent S mentioned earlier, there was produced a microwave absorber by arranging tile-like ferrite plates in a manner similar to a manner in which ferrite plates are arranged for forming a microwave anechoic chamber. Then, the microwave absorber was evaluated for microwave absorbing capacity.

Figure 17:
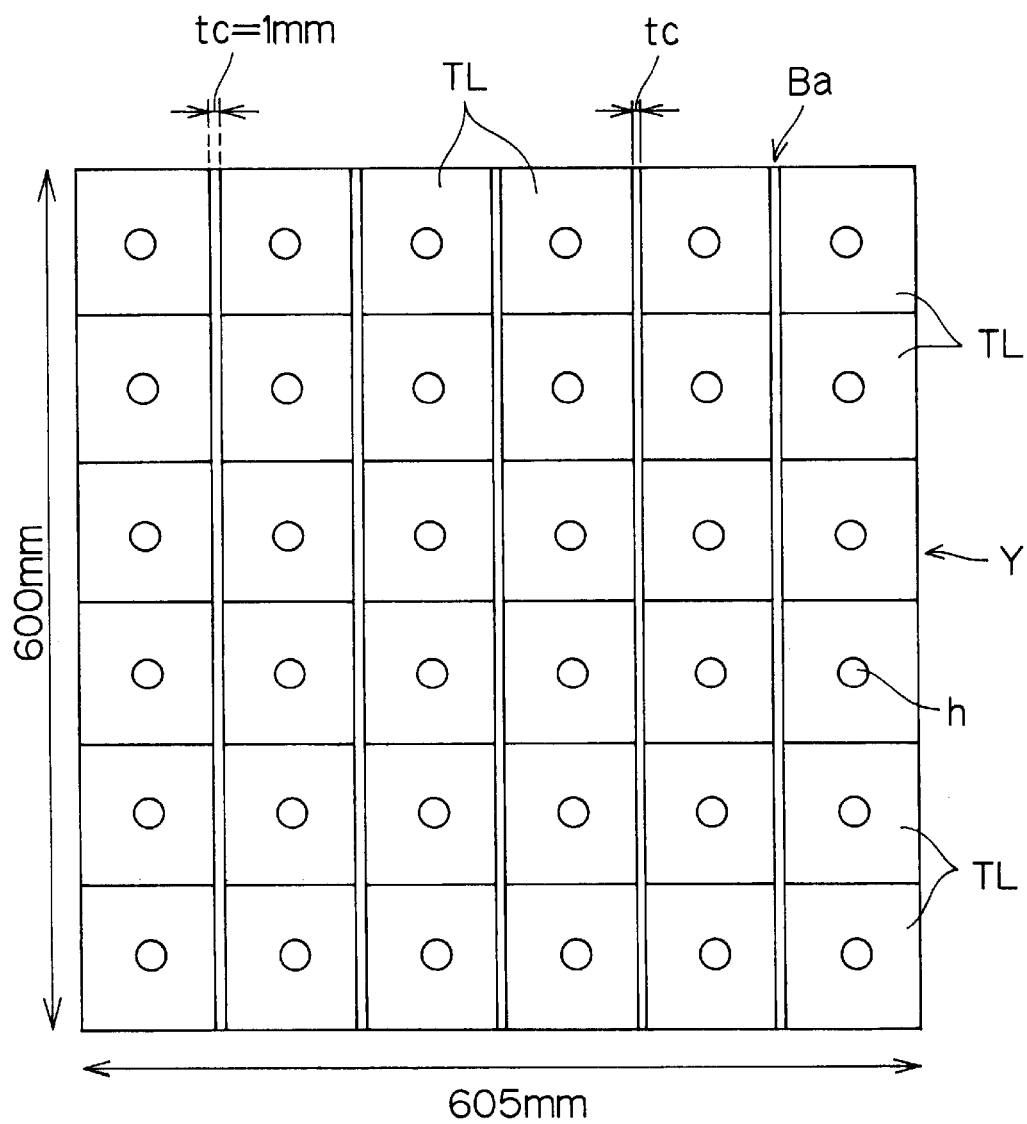
FIG. 17 is a plan view of a panel on which ferrite plates are arranged.
Figure 18:
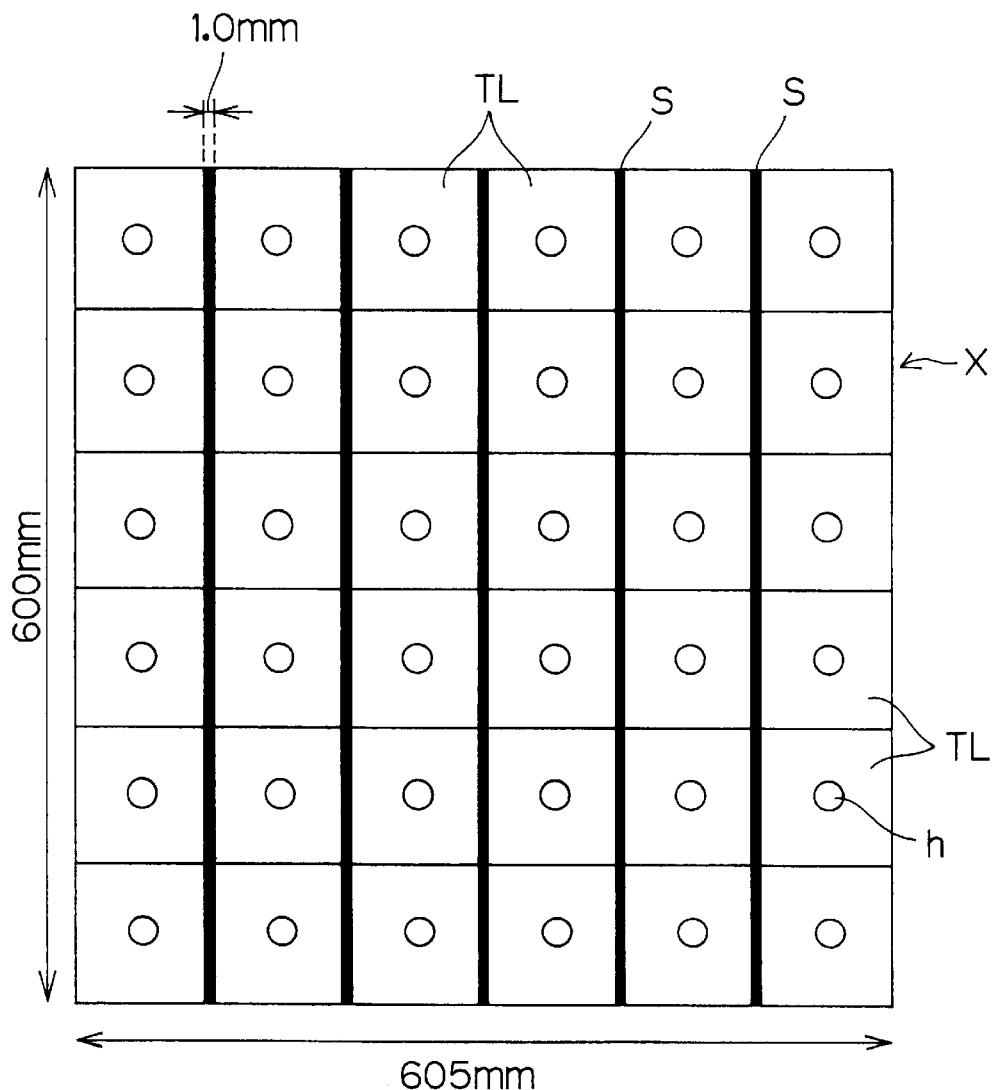
FIG. 18 is a plan view of a microwave absorber formed by filling gaps between ferrite plates of a panel in FIG. 17 with a magnetic sealing agent.

As shown in FIG. 17, 36 (6×6) ferrite plates,TL each having sizes of 100 mm×100 mm and 6 mm in thickness, were laid on and adhered to a base plate Ba of plywood panel such that no gaps were formed between adjacent ferrite plates TL in the vertical direction and such that gaps tc each having a width of 1 mm were formed between adjacent ferrite plates TL in the transverse direction. Thus, a panel Y was formed. Further, as shown in FIG. 18, the magnetic sealing agent S was applied to the gaps tc on the panel Y. The magnetic sealing agent S readily penetrated the gaps tc under a capillary action and was then hardened. Thus, a microwave absorber X was formed. Each ferrite plate TL has a center hole h having a diameter of 10 mm which may be used for attachment of the ferrite plate TL and which exerts no influence of microwave absorption.

The microwave absorber X was evaluated for microwave absorbing capacity with the use of a TEM-type measuring device capable of actually measuring a 60 cm×60 cm sample.

The evaluation result is shown by a line A2 in FIG. 19. In FIG. 19, the axis of abscissa presents microwave frequency and the axis of ordinate presents the return loss rate in dB.

Comparative Test 2

A comparative test 2 was conducted in the same manner as in Test 2, except that there was used a panel Y in FIG. 17 without the gaps tc filled with the magnetic sealing agent S. This panel Y was measured for microwave return loss rate. The result is shown by a line B2 in FIG. 19.

As apparent from FIG. 19, the microwave absorber X with the gaps tc filled with the magnetic sealing agent S of the present invention, is excellent in microwave absorbing capacity in the range of 30 MHz~100 MHz, as compared with the panel Y without the gaps tc filled with the magnetic sealing agent. For example, for the microwave of frequency of 30 MHz, the microwave absorbing capacity of the panel Y is about −7 dB, but the microwave absorbing capacity of the microwave absorber X reaches about −11 dB. It is therefore understood that the magnetic sealing agent S penetrated sufficiently the gaps tc such that the gaps tc were sufficiently filled therewith, thus contributing to microwave absorption.

After applied to the gaps and then hardened, the magnetic sealing agent S is still flexible. Accordingly, even though the gaps tc are enlarged, reduced or deformed due to distortion of the base plate Ba of the ferrite plates TL, or positional shift of ferrite plates TL, the magnetic sealing agent S can accordingly be deformed and maintain a stable magnetic circuit together with the ferrite plates TL. This enables the microwave absorber X to maintain its initial microwave absorbing capacity for a long period of time.

By merely applying the magnetic sealing agent to the gaps tc, the magnetic sealing agent S sufficiently penetrates the gaps tc and is then hardened to fill the gaps tc. This results in easy and economical production of the microwave absorber X.

After hardened in the gaps tc, the magnetic sealing agent S maintained its initial filling state and was not contracted to produce gaps again.

After left in a room for six months, the microwave absorber X underwent no change.

What is claimed is:

1. A microwave absorber attaching m method comprising:
  bonding a plurality of ferrite plates to a shield plate at an installation place;
  connecting a base portion of a support rod to the ferrite plates, causing the support rod to project therefrom;
  placing a microwave absorber with its base portion placed along the ferrite plates;
  passing the support rod through a tip opening of the microwave absorber, causing the support rod to project through the tip opening;
  passing the support rod through a cover tray to cover the microwave absorber; and
  fastening a fastening member to a tip threaded portion of the support rod, thus attaching the microwave absorber to the installation place.

2. A microwave absorber attaching method according to claim 1, wherein:
  the plurality of ferrite plates are bonded directly to the shield plate; or
  the plurality of ferrite plates are previously bonded to a panel, through which the plurality of ferrite plates are then bonded to the shield plate.

3. A microwave absorber attaching method according to claim 2, wherein:
  the gaps between adjacent ferrite plates of the plurality of ferrite plates are filled with a magnetic sealing agent; and
  the gaps between adjacent panels having ferrite plates bonded thereto are filled with a magnetic sealing agent.

4. A microwave absorber attaching method according to claim 3, wherein the magnetic sealing agent comprises magnetic powder and a binder, and is arranged to penetrate the gaps under a capillary action and to be hardened thereafter.

5. A magnetic sealing agent according to claim 4, wherein a rate of the magnetic powder in the magnetic sealing agent is in a range of 50–95% by weight.

6. A magnetic sealing agent according to claim 4, wherein the viscosity of the magnetic sealing agent is in a range of 2–7000 poises.

7. A magnetic sealing agent according to claim 4, wherein the viscosity of the magnetic sealing agent is in a range of 1000–7000 poises.

8. A magnetic sealing agent according to claim 4, wherein:
  the binder is a reactive hardening resin; and
  the magnetic sealing agent is of the two-part type including (i) a chief agent comprising the magnetic powder and a hardening resin, and (ii) a curing agent.

9. A magnetic sealing agent according to claim 4, wherein the binder is silicon- and(/or) urethane-type reactive hardening resins which will be flexible even after hardened.

10. A magnetic sealing agent according to claim 4, wherein the magnetic powder is ferrite powder.

11. A microwave absorber attaching method according to claim 1, wherein the gaps between adjacent ferrite plates of the plurality of ferrite plates are filled with a magnetic sealing agent.

12. A microwave absorber attaching method according to claim 11, wherein the magnetic sealing agent comprises magnetic powder and a binder, and is arranged to penetrate the gaps under a capillary action and to be hardened thereafter.

13. A magnetic sealing agent according to claim 12, wherein a rate of the magnetic powder in the magnetic sealing agent is in a range of 50–95% by weight.

14. A magnetic sealing agent according to claim 12, wherein the viscosity of the magnetic sealing agent is in a range of 2–7000 poises.

15. A magnetic sealing agent according to claim 12, wherein the viscosity of the magnetic sealing agent is in a range of 1000–7000 poises.

16. A magnetic sealing agent according to claim 12, wherein:
  the binder is a reactive hardening resin; and
  the magnetic sealing agent is of the two-part type including (i) a chief agent comprising the magnetic powder and a hardening resin, and (ii) a curing agent.

17. A magnetic sealing agent according to claim 12, wherein the binder is silicon- and(/or) urethane-type reactive hardening resins which will be flexible even after hardened.

18. A magnetic sealing agent according to claim 12, wherein the magnetic powder is ferrite powder.

19. A microwave absorber attaching structure for attaching a microwave absorber to a shield plate of an installation place such as a ceiling, a wall, a floor or the like, the structure comprising:
  (1) a plurality of ferrite plates bonded to a shield plate;
  (2) a support rod to be connected at a base portion thereof to the ferrite plates, causing the support rod to project therefrom;
  (3) a microwave absorber of which base portion is placed along the ferrite plates;
  (4) a covering tray allowing for the support rod to pass therethrough and project through a tip opening of the microwave absorber, such that the microwave absorber is covered by the covering tray; and
  (5) a fastening member to be fastened to a threaded portion at a tip of the support rod.

20. A microwave absorber attaching structure according to claim 19, wherein:
  the plurality of ferrite plates are bonded directly to the shield plate; or
  the plurality of ferrite plates are previously bonded to a panel, through which the plurality of ferrite plates are then bonded to the shield plate.

* * * * *